United States Patent [19]
Ueki

[11] Patent Number: 5,671,177
[45] Date of Patent: Sep. 23, 1997

[54] NON-VOLATILE SEMICONDUCTOR STORAGE APPARATUS

[75] Inventor: Hiroshi Ueki, Itami, Japan

[73] Assignee: Mitsubishi Denki Kabushiki Kaisha, Tokyo, Japan

[21] Appl. No.: 731,388

[22] Filed: Oct. 15, 1996

Related U.S. Application Data

[63] Continuation of Ser. No. 460,681, Jun. 2, 1995, abandoned.

[30] Foreign Application Priority Data

Jul. 26, 1994  [JP]  Japan ..................... 6-174516

[51] Int. Cl.$^6$ ..................................... G11C 7/00
[52] U.S. Cl. ................... 365/185.11; 365/185.12; 365/185.16; 365/185.29
[58] Field of Search .................. 365/185.11, 185.12, 365/185.16, 185.29, 185.33

[56] References Cited

U.S. PATENT DOCUMENTS

| | | | |
|---|---|---|---|
| 5,033,023 | 7/1991 | Hsia et al. ................... | 365/185.12 |
| 5,185,718 | 2/1993 | Rinerson et al. ................ | 365/185.12 |
| 5,267,196 | 11/1993 | Talreja et al. .................. | 365/185.11 |
| 5,291,045 | 3/1994 | Atsumi ........................... | 365/185.11 |
| 5,398,204 | 3/1995 | Maruyama ...................... | 365/185.12 |

FOREIGN PATENT DOCUMENTS 4-30469  2/1992  Japan.

*Primary Examiner*—David C. Nelms
*Assistant Examiner*—Vu A. Le
*Attorney, Agent, or Firm*—Lowe, Price, LeBlanc & Becker

[57] ABSTRACT

A non-volatile semiconductor storage apparatus which incorporates second bit lines connected to the sources of memory cell transistors arranged in a column direction, formed separately from the layer of first bit lines connected to the drains of the memory cell transistors arranged in a column direction. The apparatus is equipped with a system which can erase data byte by byte without enlarging the whole size irrespective of the provision of decoders in the first and second bit lines. A non-volatile semiconductor storage apparatus which erases data byte by byte by selecting a predetermined group of memory cell transistors by the source lines and the word lines connected to the diffusion area in the groups of memory cell transistors.

7 Claims, 12 Drawing Sheets

NON-VOLATILE SEMICONDUCTOR STORAGE APPARATUS

This application is a continuation of application Ser. No. 08/460,681 filed Jun. 2, 1995 abandoned Oct. 15, 1996.

BACKGROUND OF THE INVENTION

1. Field of the Invention

The present invention relates generally to a non-volatile semiconductor storage apparatus, and more particularly to a non-volatile semiconductor storage which can erase data in groups of memory cell transistors group by group.

2. Description of Related Art

FIG. 1 shows a diagram of a flash memory which is a non-volatile semiconductor storage apparatus. Control gates 1 of memory cell transistors (hereinafter called "memory cell") M arranged in a row direction (lateral direction) are respectively connected to word lines W1, W2 . . . W6 row by row. Drains D of the memory cells M arranged in a column direction (vertical direction) are respectively connected to bit lines B1, B2, B3, B4 column by column.

Each memory cell M has a floating gate 2. The sources S of the memory cells M are connected to source lines SL1, SL2, SL3, SL4 in the same row. The source lines SL1, SL2, SL3, SL4 are connected with a common source potential control line SC. The word lines W1, W2 . . . W6 and the source lines SL1, SL2, SL3, SL4 are orthogonal to the bit lines B1, B2, B3, B4 and the source potential control line SC.

FIG. 2 shows a pattern of the flash memory shown in FIG. 1. The bit lines B1, B2, B3, B4 and the source potential control line SC are formed of aluminum. The word lines W1, W2 . . . W6 are formed of polysilicon. The source lines SL1, SL2, SL3, SL4 of $N^+$ diffusion area are formed in the row direction in the P-well substrate, thereby electrically connecting the sources S of the memory cells M in the row direction to any one of the source lines SL1, SL2, SL3, SL4.

The floating gates 2 of polysilicon is formed in layer as indicated by hatching in FIG. 2. Each contact hole CH connects the $N^+$ diffusion area NZ and the bit lines B1, B2, B3, B4. The contact hole CH also connects the $N^+$ diffusion area NZ and the source potential control line SC. The control gates 1 of the memory cells M are respectively connected to the word lines W1 to W6 row by row.

The data erasing operation of this flash memory will be described:

At first, the source potential control line SC is placed at a high electrical potential, thereby placing the sources S of all the memory cells M at high potential. The word lines W1 to W6 are kept at ground potential, thereby keeping the control gates 1 of all the memory cells M at ground potential.

The bit lines B1, B2, B3, B4 are kept in open state so as to keep the drains D of the memory cells in open state, thereby causing a large potential difference between the control gates 1 of the memory cells M and the source S. This results in the withdrawal of electrons stored in the floating gate 2 to the source S under a tunnel effect. In this way data in all the memory cells M are erased. When data is to be written in the memory cell M, a predetermined bit line is placed at a suitable potential for date writing, and the source potential control line SC is placed at ground potential, and the source S of the memory cell M is also placed at ground potential. In this way a predetermined word line is placed at high potential. Thus, electrons having high energy generated in the vicinity of the drain D are drawn to the control gate 1 and injected into the floating gate and stored therein. As a result, the data is written in the memory cell M.

A flash memory which can perform byte-by-byte erasure is disclosed in, for example, Japanese Patent Application Laid-Open No. 4-30469 (1992). FIG. 3 schematically shows an electric diagram of the flash memory. In a memory cell array of this flash memory, each one word line has memory cell transistors of x bytes, and n number of the memory cells <TM1, TM2 . . . TMn> to <TMx1, TMx2 . . . TMxn> is provided in each byte. The drains D of the memory cells <TM1, TM2 . . . TMn> to <TMx1, TMx2 . . . TMxn> are connected to the corresponding bit lines <BL11 . . . BL1n> to <BLx1 . . . BLxn>, and the gates G thereof to the corresponding common word lines WL1 . . . WLm. The respective sources S are connected byte by byte to a drain D of a common transistor (TS) designed for selection.

For example, the respective sources S of the memory cells TM1 to TMn composing the first byte of the word line WL1 is connected to the drain D of the transistor TS11. Select signals SEL11 to SELmx are respectively inputted to the gates G of the transistors TS11 to TSmx. The respective sources S of the transistors TS11 to TSmx are connected to a common power source VP.

Now, the erasure effected by the flash memory will be described:

Supposing that data to be erased is stored in the first byte of the word line WL1. By the memory control circuit which outputs each control signal, the select signal SEL11 is inputted to the gate G of the transistor TS11 so as to turn on the transistor TS11. At this time, when erasing voltage is applied to the source S of the transistor TS11 from the power source VP, the voltage for erasing is applied through the transistor TS11 to the respective sources S of the memory cells TM1 to TMn which compose the first byte.

In this way, electrons stored in the respective floating gates 2 of the memory cells TM1 to TMn are traveled to the respective source S under a tunnel effect. Thus data stored in the memory cell is erased byte by byte. On inputting select signal SEL21 to the gate of the transistor TS21, the electrons stored in the floating gates 2 of the memory cells for one byte as indicated in dot-lines in FIG. 3, these areas being connected to the word line WL2, are emitted therefrom, thereby ensuring that data is erased byte by byte.

As is evident from the foregoing description, since in the conventional flash memory shown in FIG. 1, the sources of all the memory cells are connected in common, the data in the memory cells are all erased together at one time. A data in a particular memory cell at a particular address cannot be erased without erasing the data in the other memory cells. This makes it difficult to rewrite data and debug a program. When compared with EEPROM capable of erasing data in a memory cell at a particular address, the flash memory finds a narrower range of application. In addition, in layout of the pattern as shown in FIG. 2, the reduction in size is difficult. If any extra circuit is provided for the purpose of erasing data at a particular address, the flash memory disadvantageously becomes large-sized.

The conventional flash memory shown in FIG. 3 can erase data in a memory cell byte by byte, but the size becomes large so as to accommodate the same number of transistors for selection as that of all the addresses and a number of signal lines for inputting select signals to the gates of the transistors. The pattern of the flash memory becomes complicated.

SUMMARY OF THE INVENTION

The present invention is directed to solve the problems pointed out with respect to the conventional non-volatile semiconductor storage apparatus. Accordingly, a major object of the present invention is to provide a relatively small-sized non-volatile semiconductor storage apparatus which can erase data in a particular memory cell as desired.

In the non-volatile semiconductor storage apparatus according to the invention, a first bit line connected to the drains of the memory cell transistors arranged in column direction is formed in a first layer, and a second bit line connected to the sources of the memory cell transistors arranged in column direction is formed in a second layer. High potential, intermediate potential and ground potential are selectively applied to a word line connected to the memory cell transistors arranged in row direction by a word line decoder.

More particularly, the second bit line connected to a memory cell transistor to be selected is placed at a high potential, and a word line connected to the memory cell transistors not to be selected is kept at a ground potential. When intermediate potential is given to word lines connected to the memory cell transistors not to be selected and the remaining second bit lines and all the first bit lines are kept in open state, electrons of the selected memory cell transistor are drawn to the source side under a tunnel effect, thereby erasing the data in the memory cell transistor.

By forming the first bit line and the second bit line respectively in layers different from each other, the area required for forming the bit lines is reduced, thereby achieving the small-sized apparatus.

In addition, when the first bit line is formed in a zigzag form between the adjacent columns of the memory cell transistors, the number of the first bit lines can be reduced to ½ that of the second bit lines.

Another object of the invention is to provide a non-volatile semiconductor storage apparatus which allows a data byte-by-byte erasure system on a relatively small space.

A second bit line decoders for applying a predetermined potential to the second bit lines in the non-volatile semiconductor storage apparatus are provided in a predetermined number of the second bit lines respectively, and first bit line decoders are provided in half of the predetermined number of the first bit lines respectively. By providing the same number of the first and second bit line decoders as the number of bytes, data of the memory cell transistors for one byte selected by the second bit line supplied with high potential and by the word line placed at ground potential, can be erased.

In this way, when the non-volatile semiconductor storage apparatus according to the present invention is used, it can be smaller than the conventional apparatus capable of erasing data byte by byte, even when the aforementioned first and second bit line decoders are provided.

The non-volatile semiconductor storage apparatus according to the invention selects a predetermined source line by a source line decoder, from among source lines connected to diffusion areas of a group of the memory cell transistors for one byte of the same address arranged in row direction, and the selected source line is placed at a predetermined potential. The word line connected to the control gates of the memory cell transistors arranged in row direction are placed at a predetermined potential through the word line decoder.

More specifically, high potential is supplied to the source line connected to a group of the memory cell transistors to be selected by means for giving a predetermined potential, ground potential is supplied to the word line connected to a group of the memory cell transistors to be selected, intermediate potential is supplied to the word line connected to a group of the memory cell transistors not to be selected, and so that all of the bit lines are made in open state. Then electrons of the selected memory cell transistors are drawn to the source under a tunnel effect so that data is erased.

In this way, the data in the memory cell transistors for one byte selected by the source line having high potential and the word line having ground potential is erased.

The above and further objects and features of the invention will more fully be apparent from the following detailed description with accompanying drawings.

DESCRIPTION OF THE PREFERRED EMBODIMENTS

Figure 4:
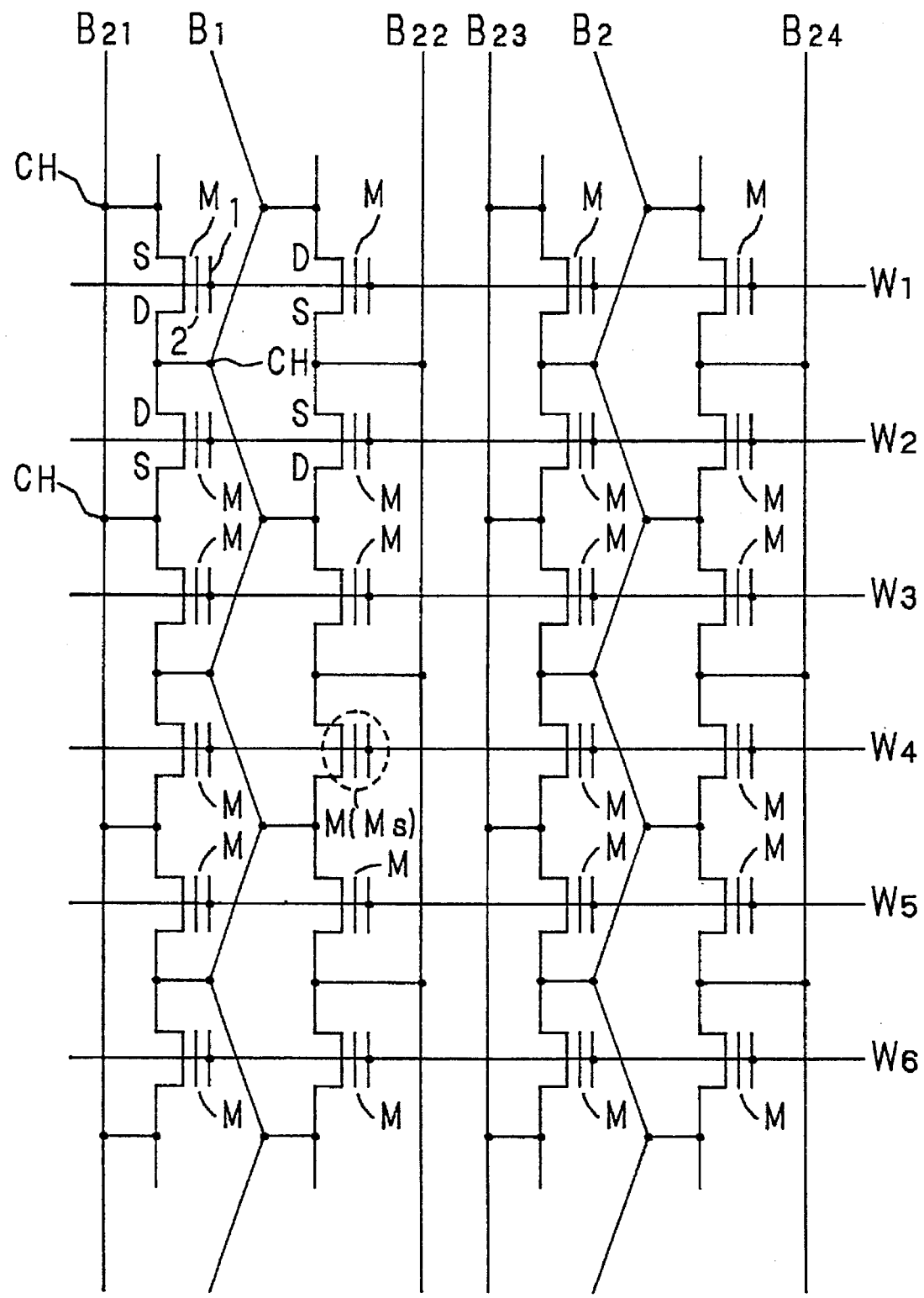
FIG. 4 is a diagram of a non-volatile semiconductor storage apparatus according to the invention.

Referring to FIG. 4, control gates 1 of memory cells M arranged in row (lateral) directions, are connected to the respective word lines W1, W2 . . . W6 row by row. The drains D of the memory cells M . . . arranged in column (vertical) directions are connected to the respective word lines W1, W2 . . . W6 row by row. The drains D of the memory cells M arranged in column (vertical) directions are connected to the respective first bit lines B1, B2 in each pair of memory cells adjacent to each other. Both of the first bit lines B1, B2 are arranged in zigzag between paired column S of memory cells. The source S of the memory cells M . . . arranged in column directions are connected to the respective second bit lines B21, B22, B23, B24 in each memory cell column. Each memory cell M has a floating gate 2.

Both of the first bit lines B1, B2 are formed in a lower layer and the second bit lines B21, B22, B23, B24 are formed in an upper layer. In this way, the second bit lines B21 to B24 and the first bit lines B1, B2 constitute a dual layer structure.

Figure 5:
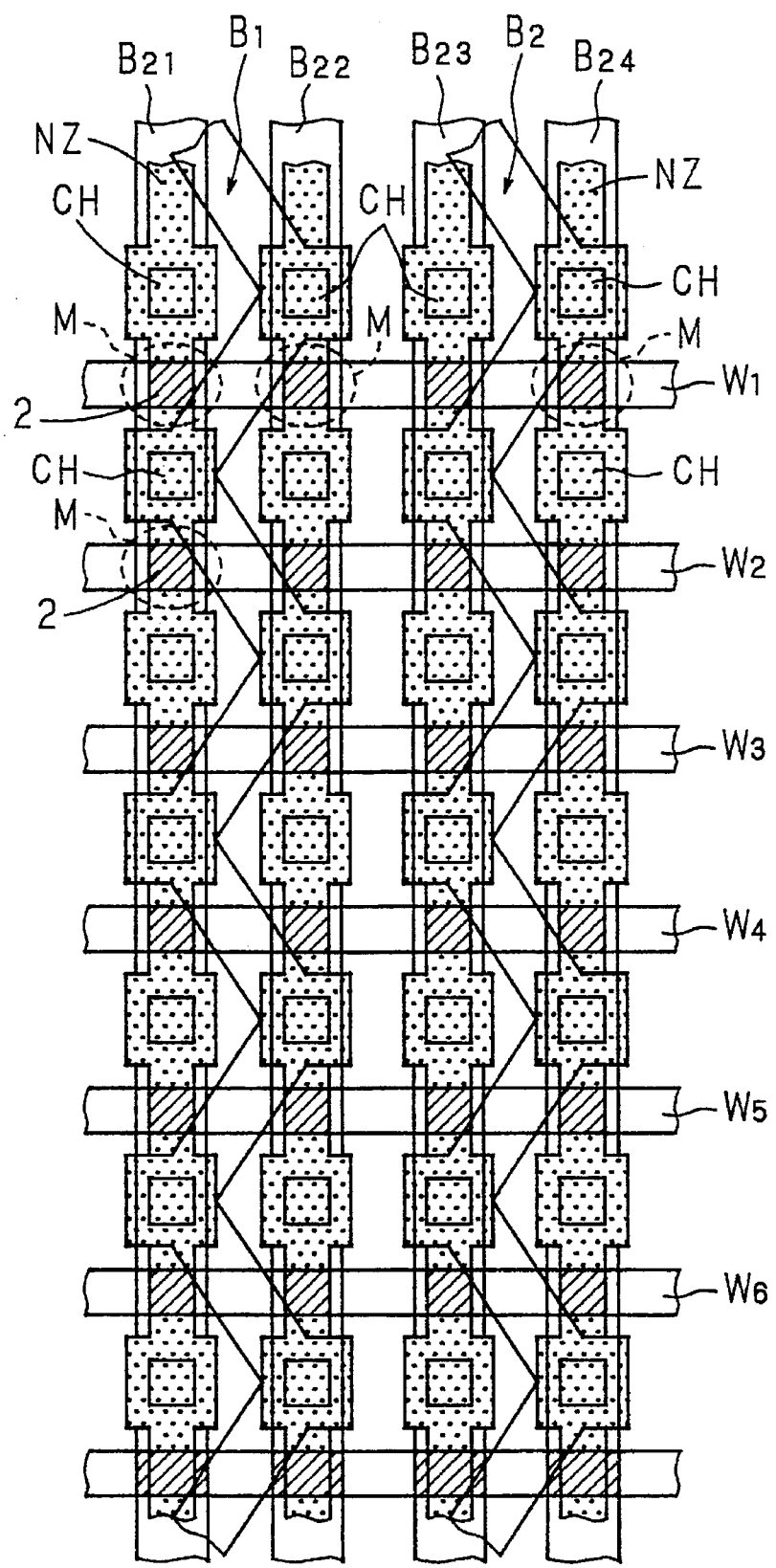
FIG. 5 shows a pattern of the non-volatile semiconductor storage apparatus.

FIG. 5 shows a pattern of a non-volatile semiconductor storage apparatus shown in FIG. 4. The first bit lines B1, B2 and the second bit lines B21 to B24 are formed of aluminum, and the word lines of polysilicon, respectively. The P-well substrate has N⁺ diffusion area NZ formed in column directions. The floating gates 2 of polysilicon layers are formed at the hatched portions in FIG. 5.

The second bit lines B21, B22, B23, B24 using upper layer are formed along the respective N⁺ diffusion areas NZ. In a lower layer under the second bit lines B21 to B24 the first bit lines B1 and B2 are formed. The first bit line B1 is formed in zigzag in the lower layer than that of the adjacent second bit line B21 and B22, and is electrically connected to the N⁺ diffusion area NZ which constitutes the drain of the memory cell M through the contact hole CH. The first bit line B1 and the second bit lines B21, B22 are insulated from each other. The first bit line B2 is formed in zigzag in the lower layer than that of the adjacent second bit lines B23, B24 and is electrically connected to the N⁺ diffusion area Z which constitutes the drain of the memory cell M through the contact hole CH. The first bit line B2 and the second bit lines B23, B24 are insulted from each other.

The word lines W1, W2 ... W6 orthogonal to the second bit lines B21, B22, B23, B24 are formed between the contact holes CH arranged in the column direction. The memory cells M are formed in the respective portions where the N⁺ diffusion areas and the word lines W1, W2 ... W6 cross each other.

Figure 1:
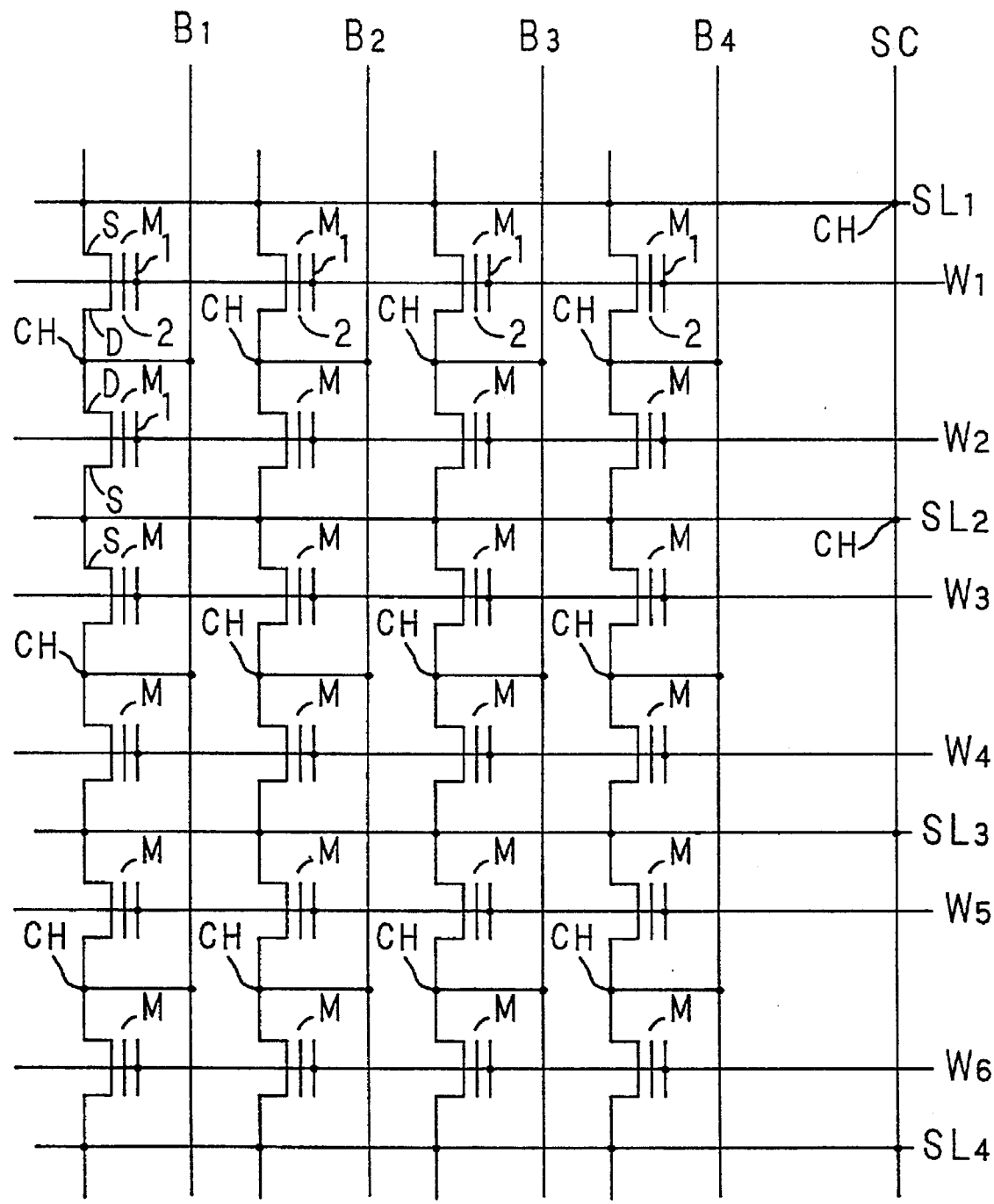
FIG. 1 is a diagram of a conventional flash memory.
Figure 2:
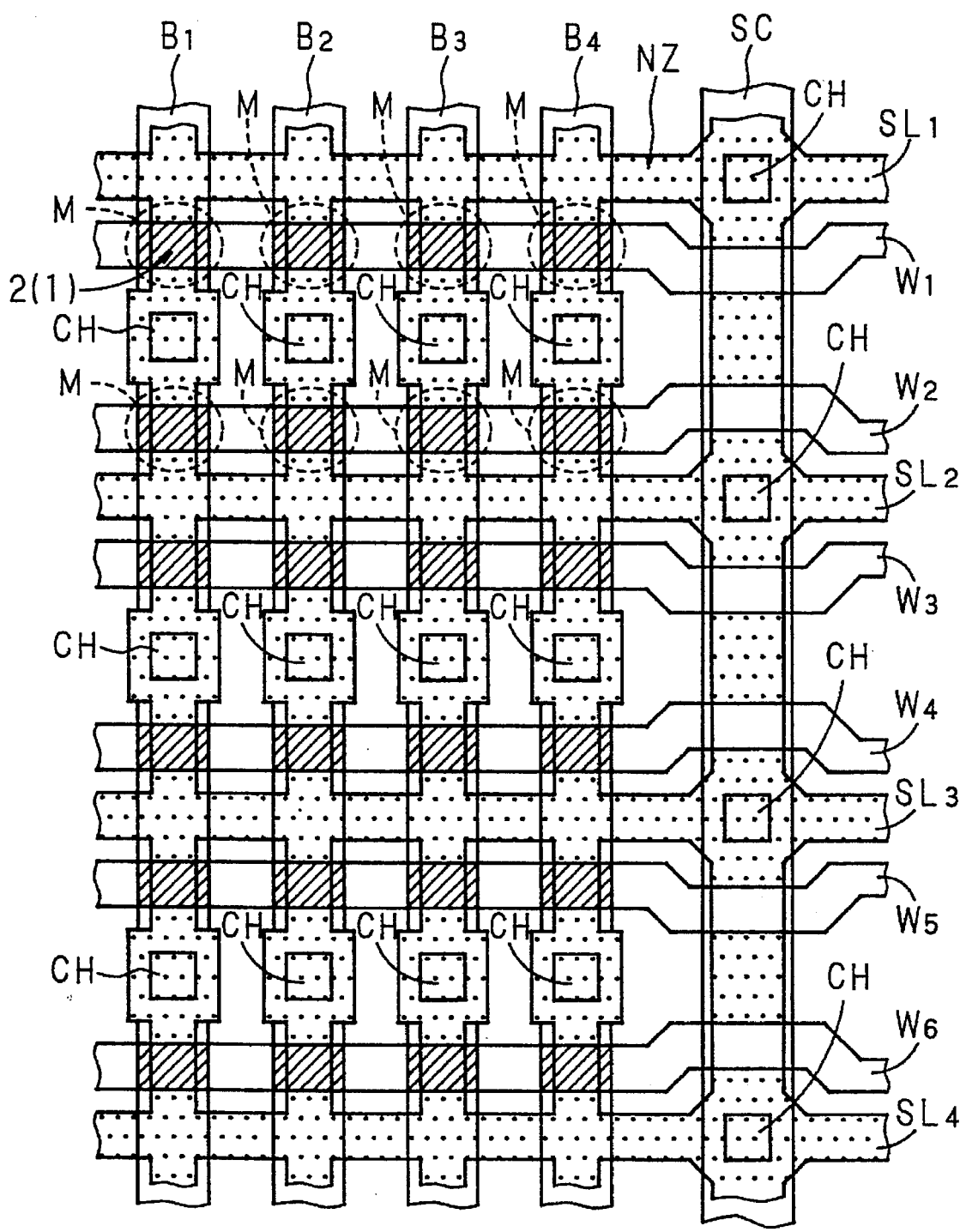
FIG. 2 shows a pattern of the flash memory.
Figure 3:
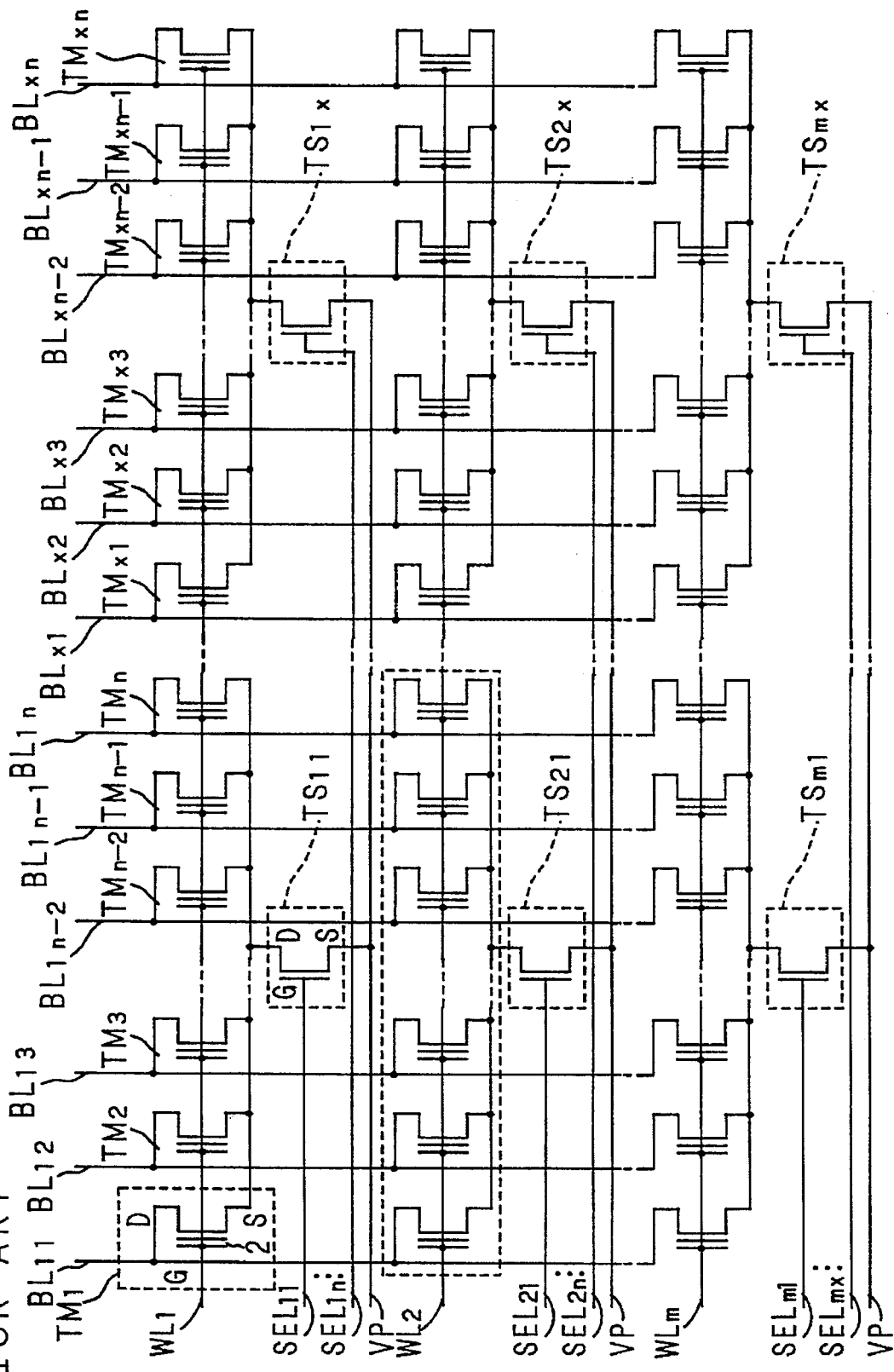
FIG. 3 is a diagram of an another conventional flash memory.

In contrast to the conventional layout shown in FIG. 2, the present invention requires no special area for forming the source line (SL) connected to the gate of the memory cell, and the second bit lines B21, B22, B23, B24 can be formed in the areas where the first bit lines B1, B2, B3, B4 are formed, and there is no need for providing areas for forming the first bit lines B1 and B2 on the plane. Accordingly, the present invention reduces spaces which otherwise would be required by the same number as that of the memory cells, thereby achieving high integration more easily than when the conventional pattern layout is replied upon.

Referring to Table 1, a typical example of the operation of the non-volatile semiconductor storage apparatus will be described, wherein the operation includes erasure, writing and reading of data. Table 1 shows potentials at which the first bit lines B1, B2, the second bit lines B21, B22, B23, B24 and the word lines W1 to W6 are placed for erasing, writing and reading. The VPP, VEE, VDD, VBB, and VCC show about 12 V, 5 to 12 V, 6 V, 1 V, and 5 V, respectively.

stored in the floating gate 2 of the memory cell MS are drawn to the N⁺ diffusion area NZ under a tunnel effect so that the data of the memory cell MS is erased with the other data remaining therein.

When data is to be written in the memory cell MS, 0 V is supplied to the second bit line B22 connected to the memory cell MS, the remaining second bit lines B21, B23, B24 being kept in open state, and voltage VDD (6 V) is applied to the first bit line B1 connected to the memory cell MS, the remaining first bit line B2 being kept in open state. Voltage VPP (12 V) is applied to the word line W4 connected to the memory cell MS and 0 V is applied to the remaining word line W1, W2, W3, W5, and W6. In this way high electric field is applied to a portion between the drain D and the control gate 1 of the memory cell MS so that electrons having high energy generated in the vicinity of the drain D are injected into the floating gate 2 due to the potential difference between the source S and the drain D, thereby enabling data to be written in the memory cell MS.

When the data in the memory cell MS is to be read, 0 V is applied to the second bit line B22 connected to the memory cell MS, the remaining second bit lines B21, B23, B24 being kept in open state, and VBB (1 V) is applied to the first bit line B1 connected to the memory cell MS. Then the remaining first bit line B2 is kept in open state and voltage VCC (5 V) is applied to the word line W4 connected to the memory cell MS, the remaining word lines W1, W2, W3, W5, and W6 being kept at 0 V. In this way, the memory cell MS is turned off or on depending upon whether the data is written or erased. The data in the memory cell MS is read out by a sense amplifier which detects the potential of the first bit line B1 connected to the memory cell MS.

As shown in the Table 1, in erasing the data, 0 V is applied exclusively to the selected word line W4 which is connected to the memory cell M3. During the period of writing and reading the data in the memory cells, high potential is applied to the selected word line W4 connected to the memory cell MS.

Figure 6:
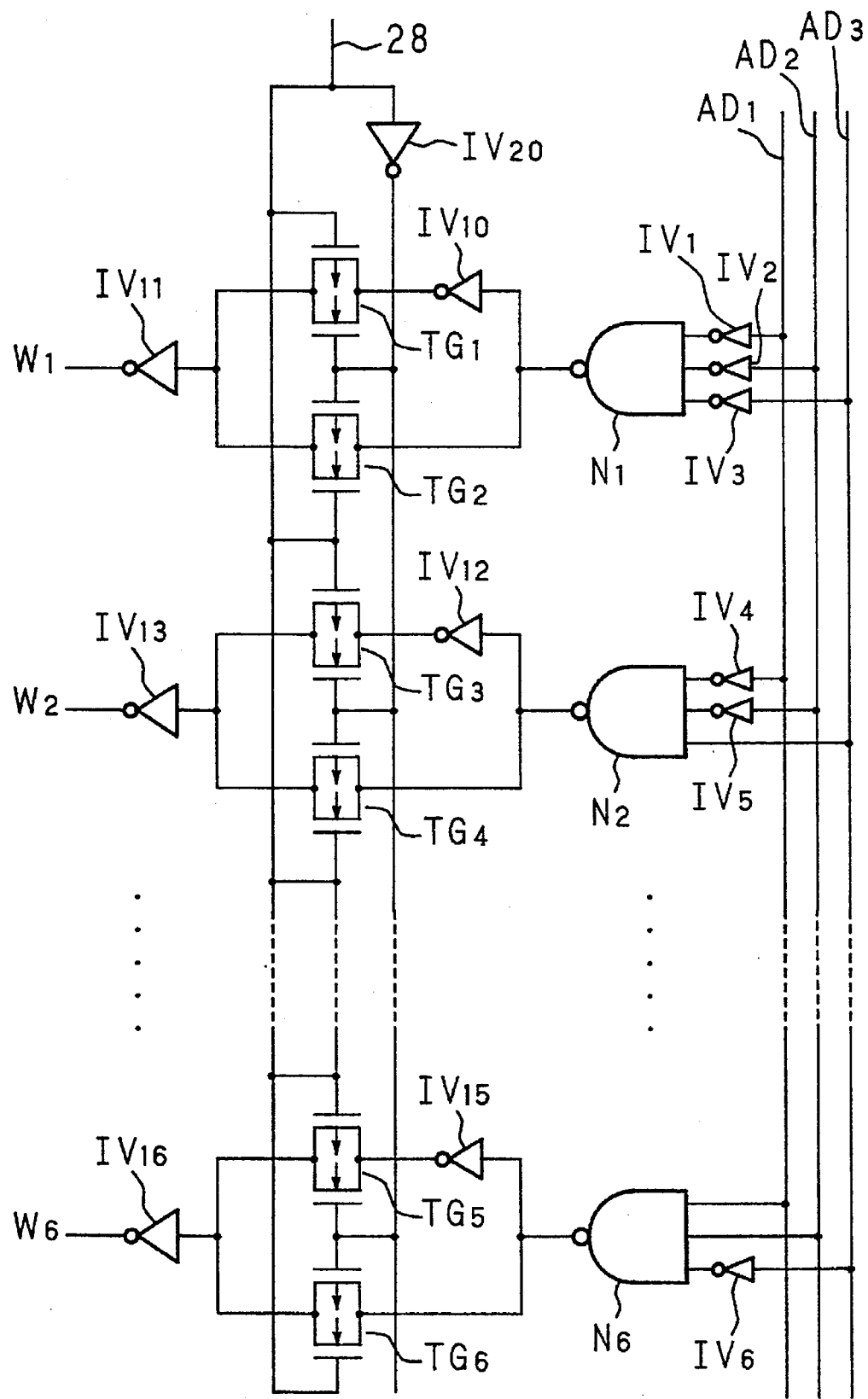
FIG. 6 is a block diagram showing a word line decoder.

Referring to FIG. 6, the manner of controlling the word lines will be described.

Address lines AD1, AD2 and, AD3 for selecting a designated word line are respectively connected to a first, a second, and a third input terminal of a three-input NAND

TABLE 1

| mode | selected B22 | non-selected B21, B23, B24 | selected B1 | non-selected B2 | selected W4 | non-selected W1, W2, W3, W5, W6 |
| --- | --- | --- | --- | --- | --- | --- |
| erasing | VPP (12 V) | open | open | open | 0 V | VEE (5–12 V) |
| writing | 0 V | open | VDD (6 V) | open | VPP (12 V) | 0 V |
| reading | 0 V | open | VBB (1 V) | open | VCC (5 V) | 0 V |

In Table 1, to erase the data in the memory cell MS indicated in dot-lines in FIG. 4 voltage VPP (12 V) is applied to the second bit line B22 connected to the memory cell MS and the remaining second bit lines B21, B23, B24 are kept in open state. 0 V (zero volt) is applied to the word line W4 connected to the memory cell MS and voltage VEE (5 to 12 V) is applied to the remaining word lines W1, W2, W3, W5, W6, and the first bit lines B1, B2 are kept in open state. In this way high electric field is applied to a tunnel oxide film between the floating gate 2 and the N⁺ diffusion are a NZ of the memory cell MS. As a result, the N⁺ diffusion area NZ on the source S reaches a high potential and the electrons circuit N1 through respective inverters IV1, IV2, and IV3. The address lines AD1 and AD2 are respectively connected to a first and a second input terminal of a three-input NAND circuit N2 through respective inverters IV4 and IV5, and the address line AD3 is directly connected to the third input terminal of the three-input NAND circuit N2. The address lines AD1 and AD2 are respectively connected to a first and a second input terminal of a three-input NAND circuit N6 directly, and the address line AD3 is connected to the third input terminal of the three-input NAND circuit N6 through and inverter IV6.

The output terminal of the NAND circuit N1 (N2) is connected to an input of an inverter IV10 (IV12), and the output terminal of an inverter IV10 (IV12) is connected to an input terminal of an inverter IV11 (IV13) through a transfer gate TG1 (TG3). The output terminal of the NAND circuit N1 (N2) is connected to the input terminal of the inverter IV11 (IV13) through a transfer gate TG2 (TG4). The output terminal of the inverter IV11 (IV13) is connected to the word line W1 (W2). The output terminal of the NAND circuit N6 is connected to an input terminal of an inverter IV15, and the output terminal of the inverter IV15 is connected to an input terminal of an inverter IV16 through a transfer gate TG5. The output terminal of the NAND circuit N6 is connected to the input terminal of the inverter IV16 through a transfer gate TG6. The output terminal of the inverter IV16 is connected to the word line W6.

A control signal line 28 for inputting a signal in the erasing mode or in the non-erasing mode is connected to an input of an inverter IV20, to the respective gates of P-channel transistor of the transfer gates TG1, TG3, TG5 and to the respective gates of N-channel transistor of the transfer gates TG2, TG4, and TG6.

The control signal line 28 is to be supplied with an address signal of "H" level at a non-erasing time, that is, the time of either writing or reading data, and with an address signal of "L" level at a data erasing time. In the word line decoder shown in FIG. 6, the values of "H" level are at voltages VEE (5–12 V), VPP (12 V) and VCC (5 V) in the respective modes shown in the Table 1, and the value of "L" level is at 0 V.

The operation of the word line decoder will be now described:

First, reference will be made to a case where the word line W2 is selected so as to control writing and reading of data.

When it is assumed that the respective address signals of the address lines AD1, AD2 and AD3 are at "L", "L", "H" levels whereas the output signal of the three-input NAND circuit N2 is at "L" level, and the output signals of the three-inputs NAND circuits N1 to N6 except the three-input NAND circuit N2 are in "H" level. At this time, since the word line decoder is in the data writing mode or data reading mode, the control signal line 28 is in "H" level and the transfer gates TG2, TG4 and TG6 are turned on. In this way the selected word line W2 alone reaches the "H" level whereas the remaining word lines are at the "L" level.

Then, reference is made to a case where the word line W2 is selected so as to control the erasure of data.

When it is assumed that the respective address signals of the address lines AD1, AD2, and AD3 are at "L", "L", and "H" levels, the output signal of the three-input NAND circuit N2 is at "L" level, and the output signals of the remaining three-input NAND circuit are at the "H" level. At this time, since the word line decoder is in the data erasing mode, the control signal line 28 is at the "L" level, and the transfer gates TG1, TG3 and TG5 are turned on. Then only the selected word line W2 is at the "L" level, and the remaining word lines are at the "H" level. Accordingly, by using the word line decoder, in accordance with the data-writing mode, data-reading mode and data-erasing mode to the selected word line is kept at an appropriate potential in accordance with the data-writing mode, data-reading mode, and data-erasing as shown in the Table 1.

So far reference has been made to a case where a particular data in a particular memory is erased in the Table 1. It is also possible to erase all data at one time called "a package erasing mode". If this package erasing mode is additionally equipped, voltage VPP is applied to the source lines and 0 V is applied to all the word lines, thereby holding all the bit lines in open state and ensuring that the data in the memory cells can be erased in package.

In the aforementioned non-volatile semiconductor storage apparatus, the first bit lines connected to the drains arranged in a column direction and the second bit lines connected to the sources arranged in a column direction are formed in separate layers from each other, thereby the apparatus can be minimized.

Figure 7:
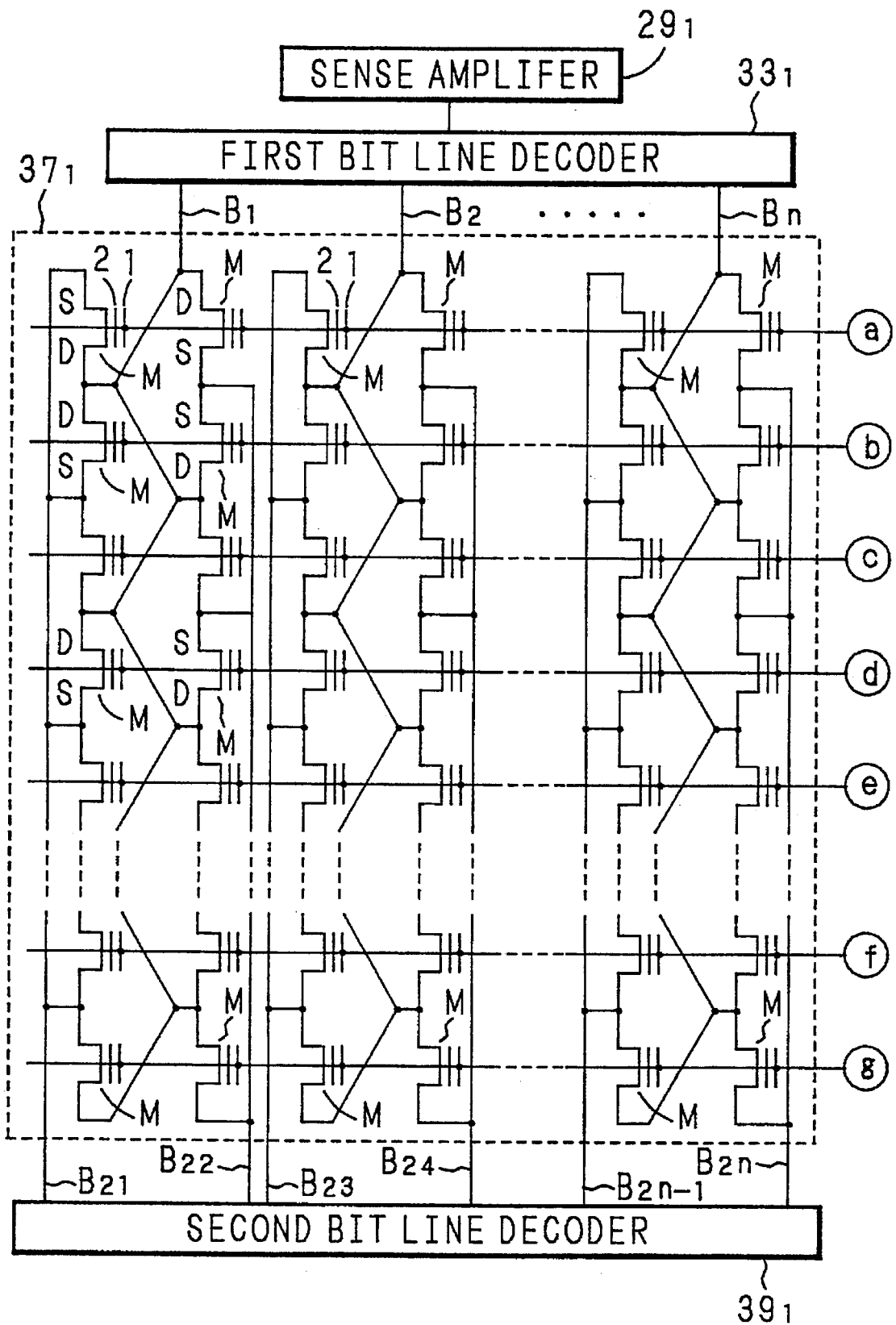
FIG. 7 is a half part of the diagram of a non-volatile semiconductor storage apparatus according to the invention capable of erasing data byte by byte.
Figure 8:
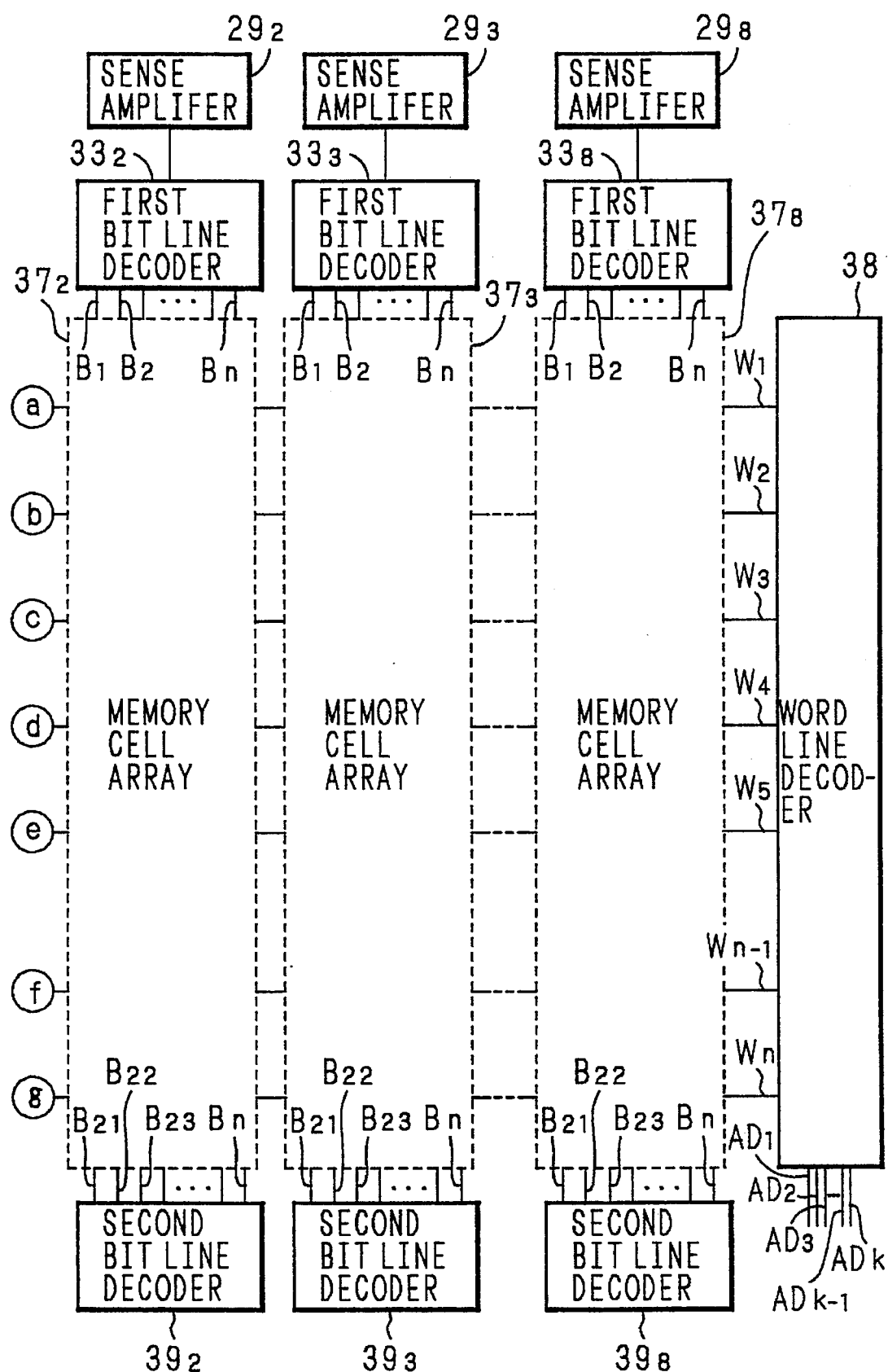
FIG. 8 is a half part of the diagram of a non-volatile semiconductor storage apparatus according to the invention capable of erasing data in byte by byte.

Then, the manner of erasing data byte by byte will be described:

Referring to FIGS. 7 and 8, the memory cell arrays $37_1$, $37_2$, ... $37_8$ have the same structure as that of the embodiment shown in FIG. 4, wherein like reference numerals designate like components to those shown in FIG. 4. One difference is that this embodiment has more memory cells in both the column and the row directions than that in FIG. 4.

The first bit lines B1, B2 ... Bn in the memory all array $37_1$, are connected to a first bit line decoder $33_1$, and the first bit line decoder $33_1$ is connected to a sense amplifier $29_1$. The second bit lines B21, B22, B23, ... B2n-1, B2n are connected to a second bit line decoder $39_1$. The memory cell array $37_2$ ($37_3$ ... $37_8$) has the same construction as that of the memory cell array $37_1$. The first bit lines B1, B2 ... Bn are connected to a first bit line decoder $33_2$ ($33_3$ ... $33_8$) and the first bit line decoder $33_2$ ($33_3$ ... $33_8$) is connected to a sense amplifier $29_2$ ($29_3$ ... $29_8$). The second bit lines B21, B22, B23 B24 ... B2n-1, B2n in the memory cell array 372 ($37_3$ ... $37_8$) are connected to a second bit line decoder $39_2$ ($39_3$ ... $39_8$).

The word lines W1, W2, ... Wn-1, Wn are connected to the memory cell arrays $37_1$, $37_2$ ... $37_8$ and also is connected to a word line decoder 38. The word line decoder 38 is connected to the addresses line AD1, AD2 ... ADK-1, and ADK. The 8-bit non-volatile semiconductor storage apparatus has the construction described above.

The data erasure procedure by this non-volatile semiconductor storage apparatus will be described:

As described by reference to FIG. 4, voltage VPP (12 V) is applied, for example, to the second bit line B22, 0 V is applied, for example, to the word line W4 and voltage VEE (5–12 V) is applied, for example, to the remaining word lines W1, W2, W3, W5 ... Wn. The remaining first bit lines and second bit lines are kept in open state. In this way, electrons are withdrawn to the source S under a tunnel effect from the memory cell M connected to the second bit line B22 and the word line W4 in each of the memory cell arrays $37_1$, $37_2$, ... $37_8$ so that the data of one byte (8 bits) are erased in package.

Because of the construction shown in FIG. 4, the apparatus of the present invention can include a data erasing system on a relatively small size space, thereby avoiding increasing in size of the apparatus even when the first bit line decoders $33_2$, $33_3$ ... $33_8$ and the second bit line decoders $39_2$, $39_3$ ... $39_8$ are provided.

In addition, by adding eight memory cell arrays in a row direction to form 16 memory cell arrays, the apparatus can erase data of 16 bits in package or at one time.

Figure 9:
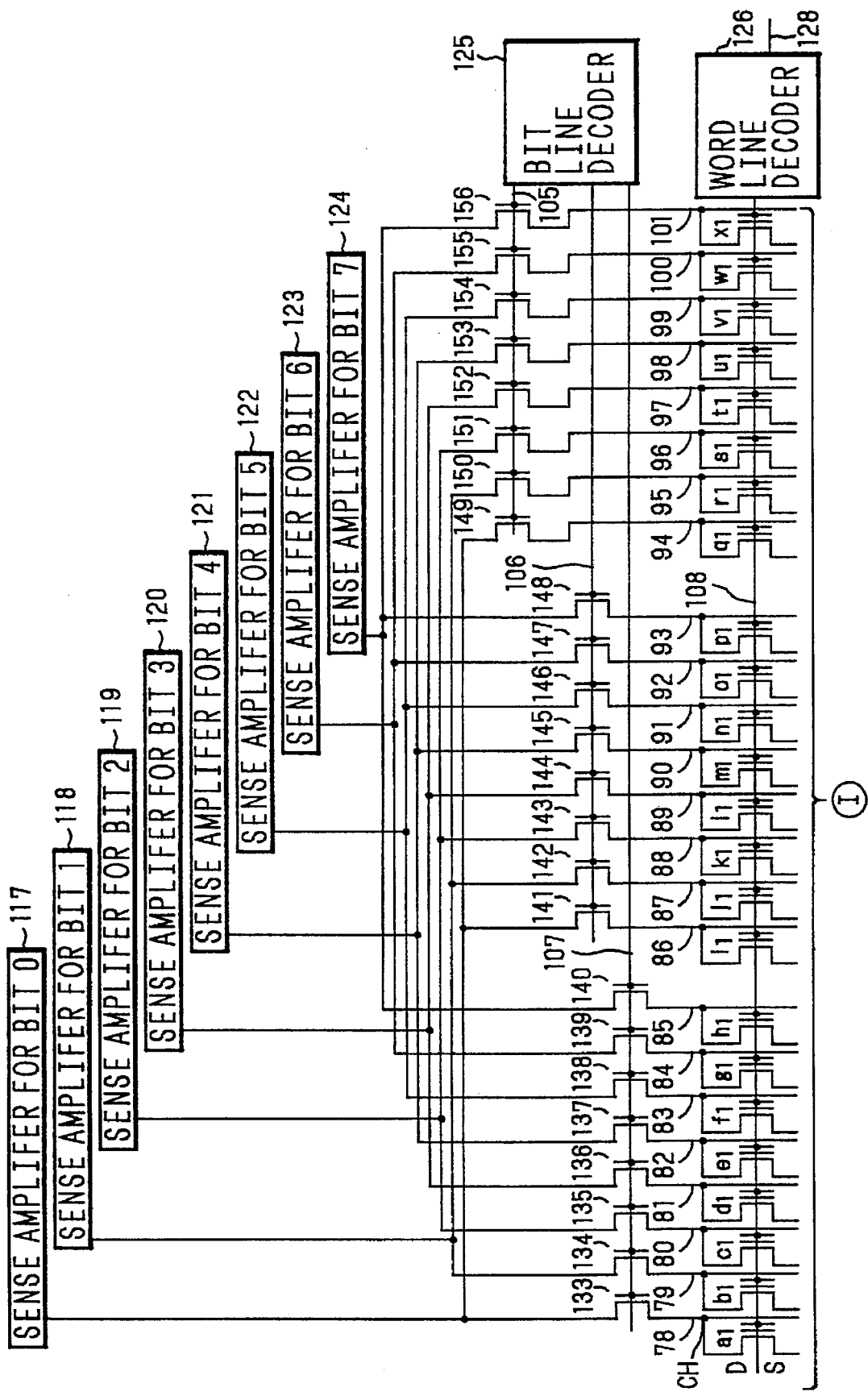
FIG. 9 is a half part of the diagram of another example of the non-volatile semiconductor storage apparatus according to the invention.
Figure 10:
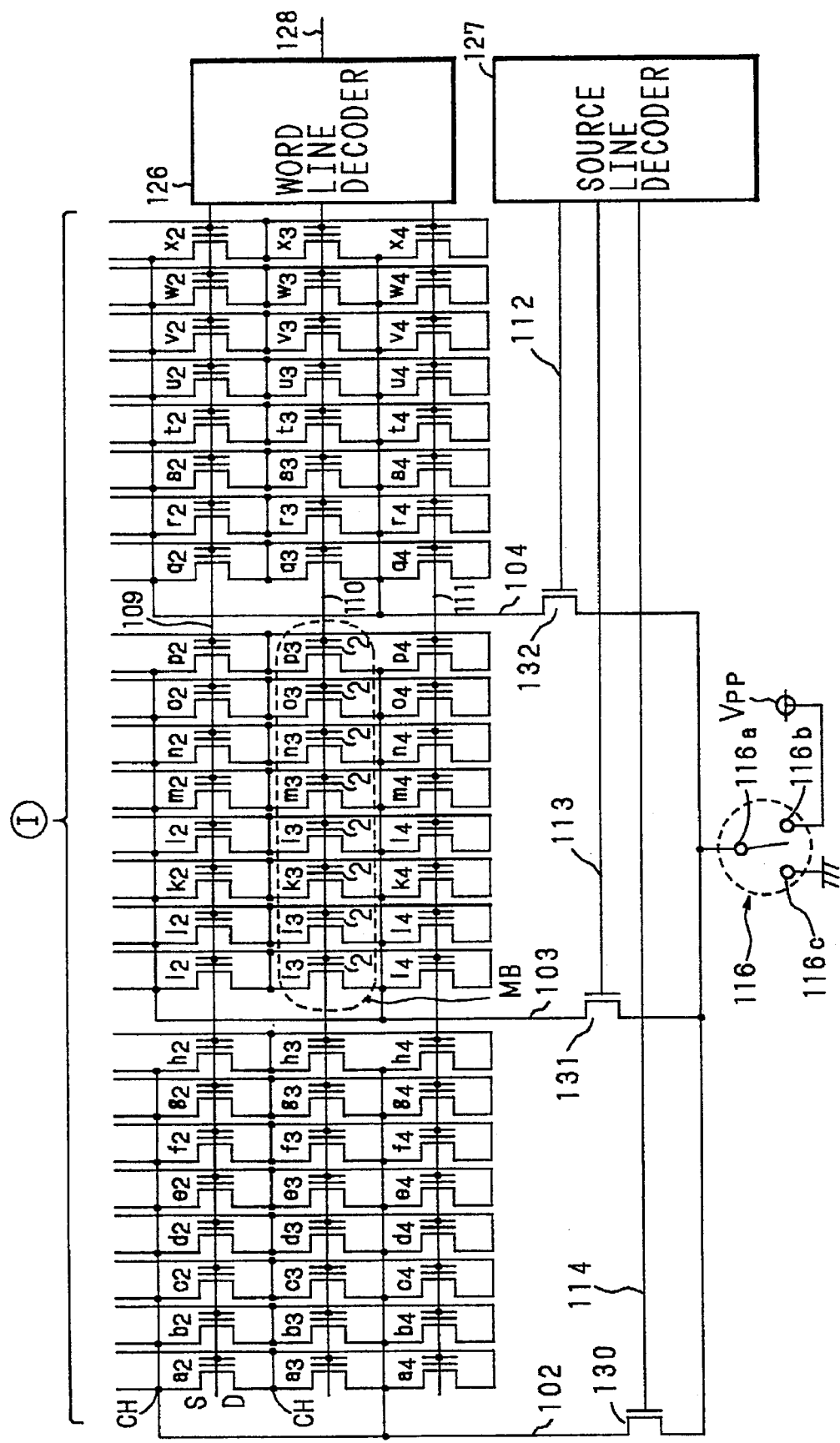
FIG. 10 is a half part of the diagram of another embodiment of a non-volatile semiconductor storage apparatus according to the invention.

Referring to FIGS. 9 and 10, another example of the embodiment will be described, wherein, for simplicity, the memory cell array includes 24 bit lines and four word lines, and here, one byte is composed of eight memory cells and the total number of addresses is 12.

A sense amplifier 117 (118, 119 ... 124) for bit 0 (1, 2 ... 7) is connected to a bit line 78 (79, 80 ... 85)

through a transistor 133 (134, 135 ... 140), is connected to a bit line 86 (87, 88 ... 93) through a transistor 141 (142, 143 ... 148), and is connected to a bit line 94 (95, 96 ... 101) through a transistor 149 (150, 151 ... 156). The bit line 78 (79, 80 ... 85) is connected to the drains D of the memory cells a1, a2, a3, a4 (<b1, b2, b3, b4>, <c1, c2, c3, c4 > ... <h1, h2, h3, h4>) connected in series. The bit line 86 (87, 88 ... 93) is connected to the drains D of the memory cells i1, i2, i3, i4 (<j1, j2, j3, j4>, <k1, k2, k3, k4 > ... <p1, p2, p3, p4>) connected in series.

The bit line 94 (95, 96 ... 101) is connected to the drains D of the memory cells q1, q2, q3, q4 (<r1, r2, r3, r4>, <s1, s2, s3, s4> ... <x1, x2, x3, x4>) connected in series. A bit line decoder 125 which selects a bit line for one byte and gives a potential to the selected bit line, is connected to the respective gates of the transistors 149, 150 ... 156 through a bit select line 105, is connected to the respective gates of the transistors 141, 142 ... 148 through a bit select line 106, and is connected to the respective gates of the transistors 133, 134 ... 140 through a bit select line 107. A word line decoder 126, which selects one word line and gives a potential to the selected word line, has the same construction as that of the word line decoder shown in FIG. 6 and comprises four word lines. The word line decoder 126 is connected to the control gates of the memory cells a1, b1 . . x1 (<a2, b2 ... x2>, <a3, b3 ... x3>), <a4, b4 ... x4>) through a word line 08 (109, 110, 111). The word line decoder 126 is connected to a control signal line 128 to which a signal selecting non-erasing mode or erasing mode is given. The respective sources S of the memory cells a1, b1 ... h1, the memory cells a2, b2 ... h2, the memory cells a3, b3 ... h3 and the memory cells a4, b4 ... h4 are connected to a source line 102 which is connected to a common terminal 106a of a switching circuit 116 through a transistor 130.

The respective sources of the memory cells i1, j1 ... p1 memory cells i2, j2 ... p2, the memory cells i3, j3 ... p3 and i4, j4 ... p4 are connected to a source line 103 which is connected to a common terminal 116a of the switching circuit 116 through a transistor 131. The respective sources of the memory cells qi, ri ... x1, memory cells q2, r2 ... x2, memory cells q3, r3 ... x3 and the memory cells q4, r4 ... x4 are connected to a source line 104 which is connected to the common terminal 116a of the switching circuit 116 through a transistor 132. To a switching terminal 116b of the switching circuit 116, voltage VPP is applied, and the switching terminal 116c is grounded. A source line decoder 127 which selects one source line and gives a potential to the selected source line, is connected to the gate of the transistor 132 through a source select line 112, is connected to the gate of the transistor 131 through a source select line 113, and is connected to the gate of the transistor 130 through a source select line 114.

Figure 11:
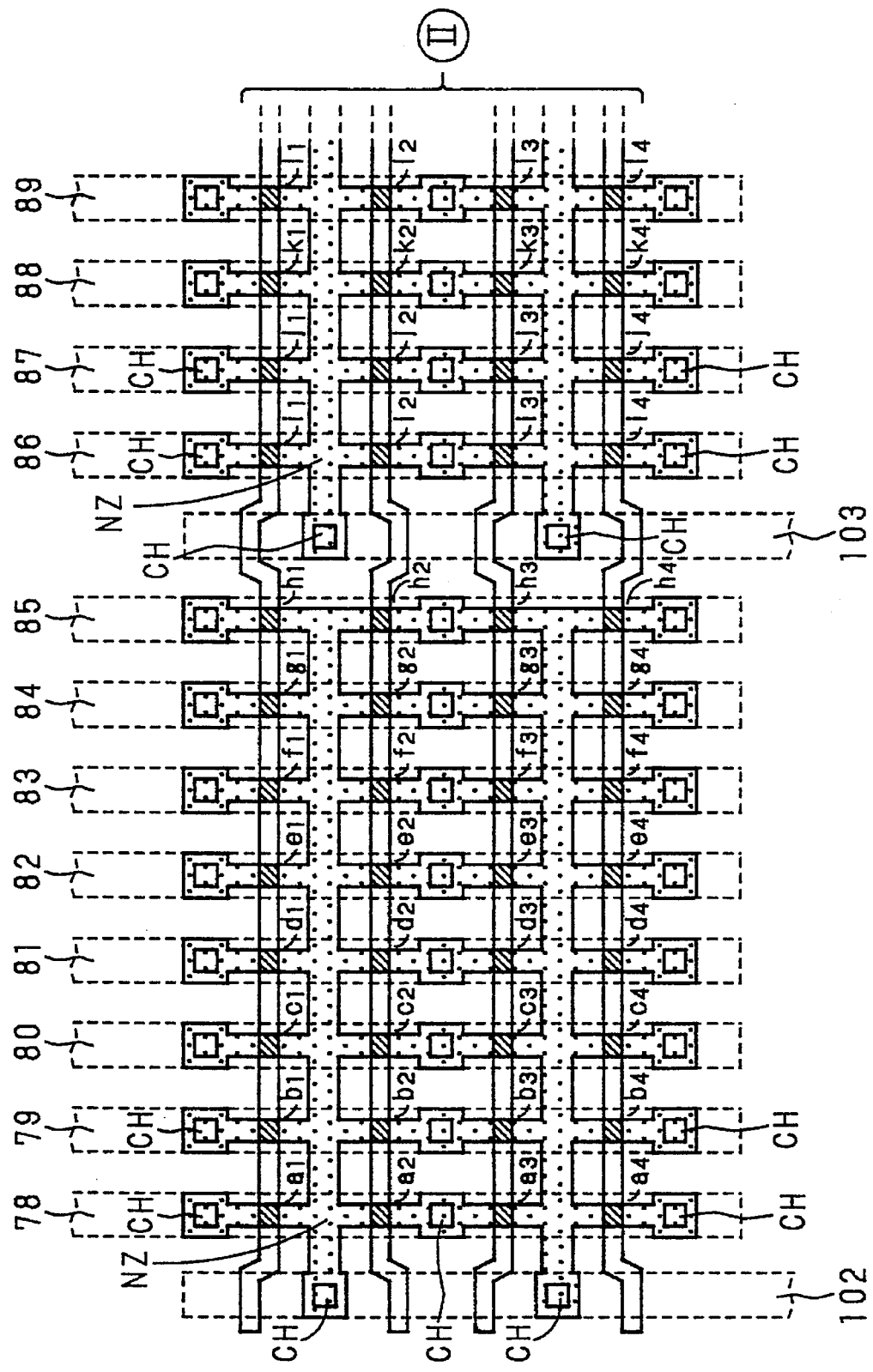
FIG. 11 shows a half part of the pattern of the non-volatile semiconductor storage apparats.
Figure 12:
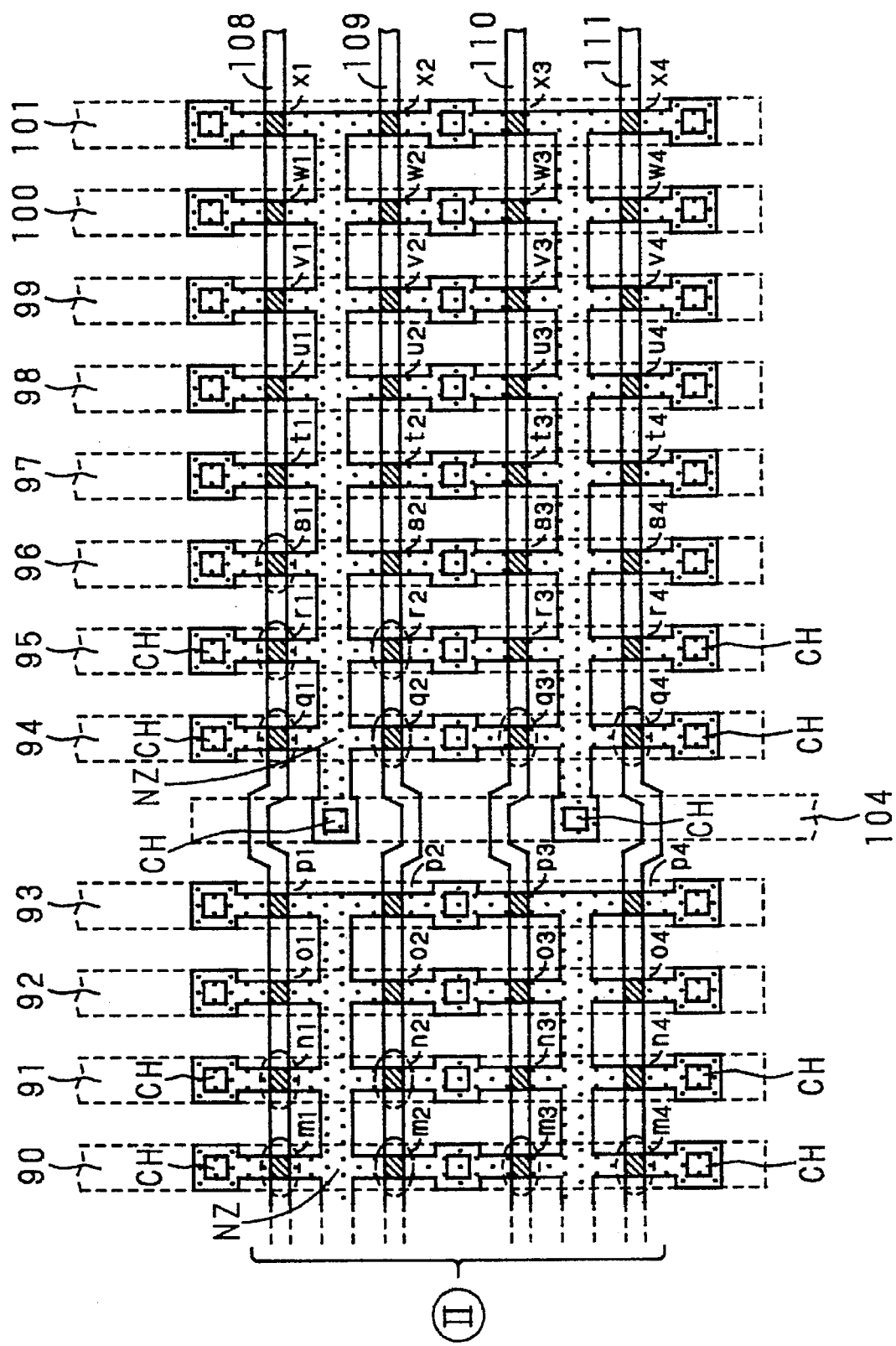
FIG. 12 shows a half part of the pattern of the non-volatile semiconductor storage apparatus.

FIG. 11 and FIG. 12 respectively show half parts of the pattern layout of the non-volatile semiconductor storage apparatus shown in FIG. 9 and FIG. 10. The bit lines 78, 79 ... 101 and the source lines 102, 103, 104 are formed of aluminum in a column direction. In the P-well substrate, $N^+$ diffusion areas NZ are formed respectively in each of the bit lines 78, 79 ... 85, bit 85, bit lines 86, 87 ... 93, bit lines 94, 95 ... 101 in a row direction. Thus the drains of the memory cells formed in column direction in the respective unit of bit lines 78, 79 ... 85, bit lines 86, 87 ... 93, bit lines 94, 95 ... 101 through the contact holes CH arranged in the bit line direction, are electrically connected to each other.

The word lines 108, 109, 110, 111 of polysilicon are formed in parallel to the $N^+$ diffusion area NZ and perpendicular to the bit lines 78, 79 ... 101. The $N^+$ diffusion area NZ on the source side facing to the $N^+$ diffusion area NZ on the drain connected to the bit lines 78, 79 ... 85 is electrically connected to the source line 102 through the contact hole CH. The $N^+$ diffusion area NZ on the source side facing to the $N^+$ diffusion area NZ on the drain side connected to the bit lines 86, 87 ... 93 is electrically connected to the source line 103 formed between the bit lines 85 and 86 through the contact hole CH. The $N^+$ diffusion area NZ on the source side facing to the $N^+$ diffusion side on the drain side connected to the bit lines 94, 95 ... 101 is electrically connected to the source line 104 formed between the bit lines 93 and 94 through the contact hole CH.

At the positions hatched in FIGS. 11 and 12 where the $N^+$ diffusion areas NZ and the word lines 108, 109, 110, 111 intersect each other are formed floating gates of polysilicon, thereby forming memory cells. The source lines 102, 103, 104 are formed in layer in the same manner as the bit layers 78 to 101. For example, memory cells a1, a2, a3, a4 are formed along the bit lines 78. In FIGS. 11 and 12 like reference numerals designate like components and elements in FIG. 8 and FIG. 9.

Table 2 shows potentials to be taken by the bit lines 78 to 101, source lines 102 to 104, word lines 108 to 111 in the cases where data erasing, data writing, data reading of the memory cell group MB for one byte belonging to the same address indicated by dot lines in FIG. 10, wherein VPP, VEE, VDD, VBB, and VCC are respectively about 12 V, 5 to 12 V, 6 V, 1 V, 5 V, and 0 (zero) V is ground potential. In a state referred to as "open" the same effect results even if 0 V is applied.

TABLE 2

| mode | selected source line 103 | non-selected source lines 102, 104 | selected bit lines 86–93 | non-selected bit lines 78–85, 94–101 | selected word line 110 | non-selected word lines 108, 109, 111 |
| --- | --- | --- | --- | --- | --- | --- |
| byte erasing | VPP (12 V) | open | open | open | 0 V | VEE (5–12 V) |
| writing | 0 V | open | VDD (6 V) | open | VPP (12 V) | 0 V |
| reading | 0 V | open | VBB (1 V) | open | VCC (5 V) | 0 V |

The procedure of erasing data in the memory cell group MB for one byte belonging to the same address indicated by dot lines in FIG. 10. The switching circuit 116 is switched toward a switching circuit 116b, so that the source select line 113 is selected by the source line decoder 127 to turn on the transistor 131 according to Table 2, the source line 103 connected to the memory cell group MB is supplied with voltage VPP (12 V) and the remaining source lines 102, 104 are kept in open state, the word line 110 connected to the memory cell group MB is selected, 0 V being applied to the selected word line 110 and the remaining word lines 108, 109, 111 and the remaining word lines 108, 109, 111 are supplied with voltage VEE (5–12 V). All of the bit lines 78–101 are kept in open state.

0 V is applied to the control signal line 128 so as to select the word line 110 by the word line decoder 126 as shown in FIG. 6. More particularly, 0 V is applied only to the word line 110 and VEE (5–12 V) is applied to the remaining word lines 108, 109, 111. All the bit select lines 105, 106, 107 are placed in a non-selective (0 V) state through the bit line decoder 125. Thus all the transistors 133 to 156 are turned off and all of the bit lines including the bit lines 86–93 connected to the memory cell group MB become open.

In this way, high electrical field is applied to a tunnel oxide film between the floating gates 2 of the eight memory cells i3, j3, l3, m3, n3, o3, p3 included in the memory cell group MB and the $N^+$ diffusion area NZ. Thus electrons stored in the floating gate 2 are drawn to the $N^+$ diffusion area NZ on the source under a tunnel effect, thereby erasing the data in the memory cell group MB for one byte including memory cells of i3, j3 . . . p3 of the memory cell group MB in package.

When data is to be written in the memory cell group MB, the switching circuit is switched to the ground so that the transistor 131 is turned on. Thus, the source line 103 is placed at a ground potential while the remaining source lines 102 and 104 are kept in open state and the selected bit lines 86 to 93 are supplied with VDD (6 V). The remaining bit lines 78 to 85, 94 to 101 are kept in open state, the selected word lines 110 is supplied with voltage VPP (12 V) and the remaining word lines 108, 109, 111 are supplied with 0 V. Then high electrical field is applied between the drain and the control gate of the memory cell in the memory cell group MB, electrons having high energy generated in the vicinity of the drain D due to the potential difference between the source S and the drain D, are injected into the floating gate, thereby writing data in the memory cell.

When data in the memory cell of the memory cell group MB, the selected source line 103 is supplied with 0 V so that the remaining source lines 102 and 104 are kept in open state, the selected bit lines 86 to 93 are supplied with VBB (1 V) and the remaining bit lines 78 to 85, 86 to 101 are made in open state. The selected word line 110 is supplied with voltage VCC (5 V) and the remaining word lines 108, 109, 111 with 0 V. Then, the memory cell in the memory cell group MB is turned off (on) when the data is written (erased) and the data of the memory cell is read out to the bit lines 86 to 93. In the other memory cell group, the same procedure is taken.

It is optional how many bit lines, word lines and source lines should be used, and the present invention is not limited to the numbers referred to above. The magnitude of potential at which the bit lines, word lines and source lines can be appropriately selected.

The non-volatile semiconductor apparatus according to the present invention does not require the same number of switching transistors as that of the addresses, or does not require such a great number of select signal lines as the conventional apparatus do. In addition, the apparatus is capable of erasing data byte by byte. Thus the pattern areas are not increased, and keep high integration, and data can be erased byte by byte or in package.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bound of the claims, or equivalence of such metes and bound thereof are therefore intended to be embraced by the claims.

What is claimed is:

1. A non-volatile semiconductor memory device comprising:

a number of memory cell transistors arranged in row and column directions;

word lines connected to the control gates of a plurality of memory cell transistors arranged in the row direction;

a word line decoder for selecting at least one of said word line;

a word line potential supplying means for supplying a first potential for the word line selected by said word line decoder during a first operating mode of the memory device, a second potential different from said first potential for the same during a second operating mode of the memory device, and a third potential different from said first and second potentials for the same during a third operating mode of the memory device;

source lines connected to diffusion areas of memory cell transistor groups in the column direction, each of said memory cell transistor groups arranged in the column direction, each of said memory cell transistor groups having a predetermined number of the memory cell transistors whose control gates are connected to one of said word lines;

a source line decoder for selecting at least one of said source lines; and a source line potential supplying means for supplying a fourth potential for the source line selected by said source line decoder during said first operating mode of the memory device, and a fifth potential different from said fourth potential for the same during said second or third operating mode of the memory device.

2. The non-volatile semiconductor memory device according to claim 1, further comprising:

bit select lines arranged respectively in the plurality of said group of memory cell transistors arranged in the column direction; and a bit line decoder for selecting one bit line from a plurality of bit select lines.

3. A non-volatile semiconductor memory device according to claim 1, wherein said first operating mode is an erasing mode, said word line potential supplying means supplies a ground potential for the selected word line as said first potential and a relatively high potential for an unselected word line, and said source line potential supplying means supplies a very high positive potential for the selected source line as said fourth potential.

4. A non-volatile semiconductor memory device according to claim 1, wherein said second operating mode is a writing mode, said word line potential supplying means supplies a very high positive potential for the selected word line as said second potential and a ground potential for an unselected word line, and said source line potential supplying means supplies a ground potential for the selected source line as said fifth potential.

5. A non-volatile semiconductor memory device according to claim 1, wherein said third operating mode is a reading mode, said word line potential supplying means supplies an intermediate potential for the selected word line as said third potential and a ground potential for an unselected word line, and said source line potential supplying means supplies a ground potential for the selected source line as said fifth potential.

6. A non-volatile semiconductor memory device according to claim 1, wherein said word line potential supplying means includes for one word line;

a logic circuit whose input terminals are connected to address lines through inverters or through no inverter; and two gate circuits, one is connected with an output terminal of said logic circuit and the other is connected with said output terminal logic circuit through an inverter, these gate circuits being connected to one word line, and controlled by a control signal indicating an erasing mode or non-erasing mode.

7. A non-volatile semiconductor memory device according to claim 1, wherein said source line potential supplying means includes a gate circuit for each source line, which is switched on/off by said source line decoder and connected to two potential sources through a switch.

* * * * *